United States Patent [19]

Park

[11] Patent Number: 5,995,853
[45] Date of Patent: Nov. 30, 1999

[54] POWER CONTROL TECHNIQUE OF RADIO COMMUNICATION SYSTEM

[75] Inventor: Hyung-Weon Park, Seoul, Rep. of Korea

[73] Assignee: SamSung Electronics Co., Ltd., Kyungki-do, Rep. of Korea

[21] Appl. No.: 08/928,590

[22] Filed: Sep. 12, 1997

[30] Foreign Application Priority Data

Sep. 13, 1996 [KR] Rep. of Korea ...................... 96-39866

[51] Int. Cl.⁶ .............................. H04B 1/04; H04B 7/00; H04B 1/38
[52] U.S. Cl. ......................... 455/574; 455/115; 455/126; 455/127; 455/69
[58] Field of Search ............................... 455/69, 574, 68, 455/126, 70, 91, 38.3, 115, 117, 73, 78, 84, 343

[56] References Cited

U.S. PATENT DOCUMENTS

| | | |
|---|---|---|
| 4,553,105 | 11/1985 | Sasaki . |
| 4,590,417 | 5/1986 | Tanaami et al. . |
| 4,999,583 | 3/1991 | Washburn et al. . |
| 5,107,487 | 4/1992 | Vilmur et al. ............................ 370/18 |
| 5,152,004 | 9/1992 | Väisänen et al. . |
| 5,179,353 | 1/1993 | Miyake . |
| 5,179,724 | 1/1993 | Lindoff .................................... 455/76 |
| 5,193,223 | 3/1993 | Walczak et al. ........................ 455/115 |
| 5,241,694 | 8/1993 | Väisänen et al. . |
| 5,287,555 | 2/1994 | Wilson et al. .......................... 455/115 |
| 5,307,512 | 4/1994 | Mitzlaff . |
| 5,410,729 | 4/1995 | Kumagai et al. ...................... 455/12.1 |
| 5,430,411 | 7/1995 | Boulic . |
| 5,438,683 | 8/1995 | Durtler et al. . |
| 5,483,679 | 1/1996 | Sasaki ...................................... 455/86 |
| 5,487,179 | 1/1996 | Larsson . |
| 5,507,016 | 4/1996 | Okuhara . |
| 5,524,287 | 6/1996 | Yokoya et al. ......................... 455/126 |
| 5,539,925 | 7/1996 | Yli-Kotila et al. ..................... 455/38.3 |
| 5,551,057 | 8/1996 | Mitra . |
| 5,566,363 | 10/1996 | Senda . |
| 5,574,993 | 11/1996 | Kobayashi et al. . |
| 5,590,396 | 12/1996 | Henry ..................................... 455/33.1 |
| 5,646,578 | 7/1997 | Loh et al. . |
| 5,669,066 | 9/1997 | Borg et al. ............................... 455/69 |
| 5,806,006 | 9/1998 | Dinkins .................................. 455/574 |
| 5,838,720 | 11/1998 | Morelli .................................... 375/219 |
| 5,881,370 | 3/1999 | Pottala et al. ............................. 455/78 |

FOREIGN PATENT DOCUMENTS

WO 93/02505A1 2/1993 WIPO .

Primary Examiner—Dwayne D. Bost
Assistant Examiner—Joy Redmon
Attorney, Agent, or Firm—Robert E. Bushnell, Esq.

[57] ABSTRACT

A radio transmission/reception system using the same frequency includes a power control circuit which can prevent a sensitivity of the receiver from being lowered due to the carrier radiated from the transmitter, and finely control the power. The power control circuit includes first and second variable attenuators being respectively installed at an intermediate frequency stage and a local oscillator frequency stage, so as to finely control the power level of a next radio frequency stage. A CPU (central processing unit) controls amounts of attenuation of the first and second variable attenuators. Each of the first and second attenuators includes a first pin diode connected so as to be turned on in response to a signal level from the intermediate frequency stage and so as to generate a first current flowing toward an output of the attenuator, and a second pin diode connected so as to be turned on in response to a signal level from the central processing unit and so as to generate a second current flowing in an opposite direction of the first current.

5 Claims, 4 Drawing Sheets

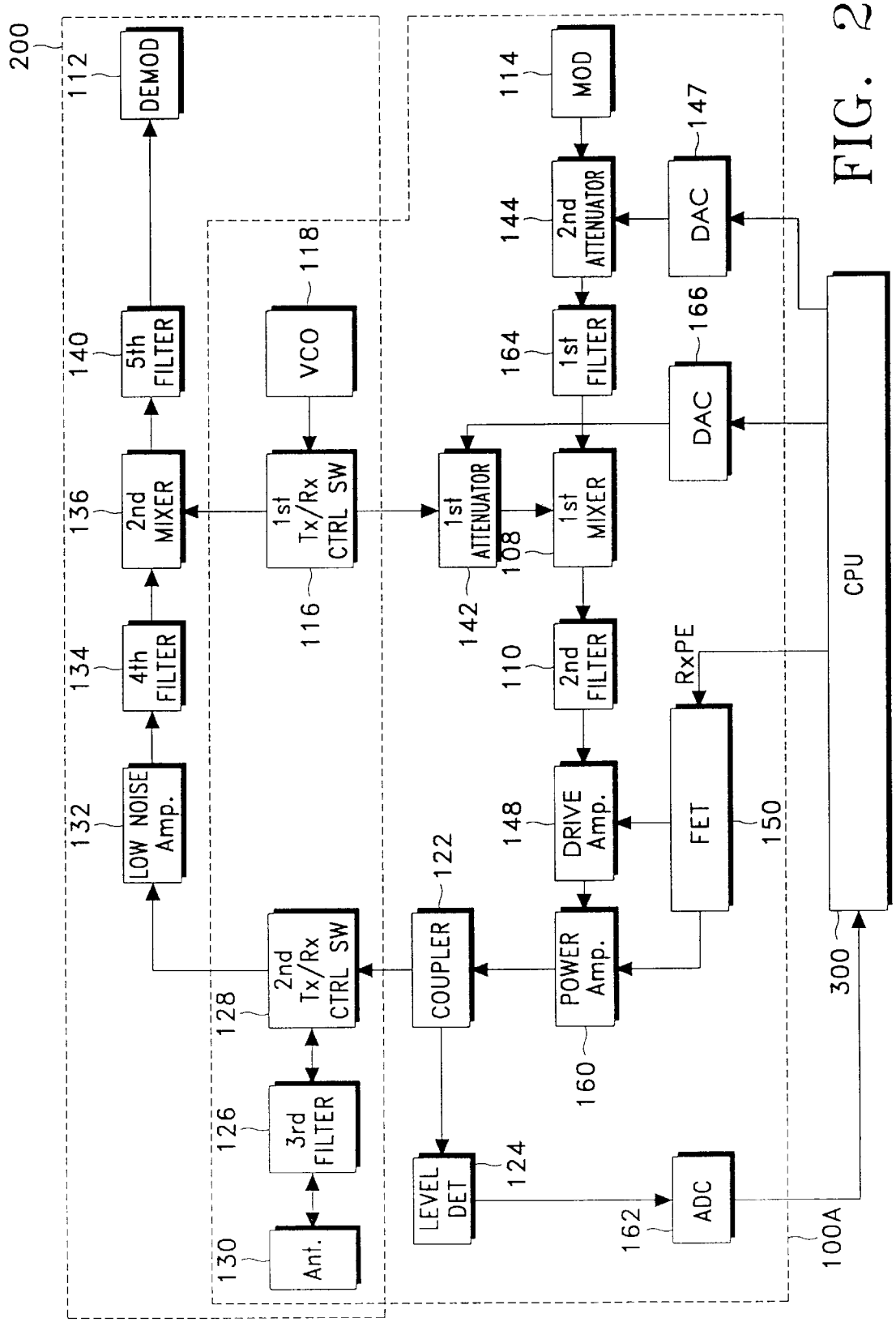

POWER CONTROL TECHNIQUE OF RADIO COMMUNICATION SYSTEM

CLAIM OF PRIORITY

This application makes reference to, incorporates the same herein, and claims all benefits accruing under 35 U.S.C. §119 from an application for POWER CONTROL CIRCUIT OF RADIO COMMUNICATION SYSTEM AND METHOD THEREOF earlier filed in the Korean Industrial Property Office on the Sep. 13, 1996 and there duly assigned Ser. No. 39866/1996.

BACKGROUND OF THE INVENTION

1. Field of the Invention

The present invention relates to a radio communication system, and more particularly to a power control technique for controlling transmission power of a radio transmitter/receiver using a same frequency.

2. Description of the Related Art

In general, a transmission power of a radio communication system is controlled by controlling a gain of a multistage amplifier in the system. In particular, in a radio communication system sharing the same frequency in both the transmission and reception modes, a battery may be rapidly exhausted because the battery is continuously used for transmitting a signal. Further, in case of using a plurality of radio communication systems at the same time, the radio communication systems may interfere with one another. Therefore, it is necessary to control the transmission power.

An earlier power control circuit includes a transmitter, a receiver, and a central processing unit (CPU). In a transmission mode by the transmitter, a modulation signal output from a modulator is first amplified by a multistage amplifier in an intermediate frequency (IF) stage and transferred to an input of a first mixer via a first filter.

A local oscillator signal output from a voltage controlled oscillator (VCO) is transferred to another input of the first mixer via a first transmission/reception control switch and then the first mixer mixes the modulation signal with the local oscillator signal to generate a radio frequency signal. The radio frequency signal output from the first mixer is filtered by a second filter and supplied to a multistage amplifier in a radio frequency (RF) stage i.e., a drive amplifier and a power amplifier. The gain controlled signal output from the power amplifier is supplied to a coupler and transmitted in the air via second transmission/reception control switch, a third filter, and an antenna. The coupler divides a power of the power amplifier so as to allow a level detector to detect a power level of the gain controlled signal output from the power amplifier. The level detector provides the central processing unit with the level detection result via an analog-to-digital converter. The central processing unit detects the magnitude of the signal output from the level detector and generates control signals to control the outputs of the multistage amplifier, the drive amplifier and the power amplifier so as to control the transmission power. The first and second transmission/reception control switches determine a transmission/reception path under the control of the central processing unit.

In the reception mode, the receiver receives reception data via the antenna and the reception date is supplied to a low noise amplifier by way of a third filter and the second transmission/reception control switch. A signal amplified by the low noise amplifier is filtered by a fourth filter and supplied to an input of a second mixer. The local oscillator signal output from the voltage controlled oscillator is supplied to another input of the second mixer via the first transmission/reception control switch and the second mixer mixes the above-mentioned signals supplied to the inputs thereof to generate a demodulation signal. The demodulation signal is supplied to a demodulator via fifth filter and demodulated into an original signal by the demodulator.

Therefore, when an antenna port of a counterpart's receiver needs a constant power level, a transmission power of the transmitter must be matched with an input level of the counterpart's receiver by using a variable attenuator for varying a gain of the amplifier.

However, since the variable attenuator used for controlling the power includes the multistage amplifier, it is impossible to know a dynamic range of the amplifier, which results into a difficulty in controlling the power. Further, in case of mass-producing the system, it is difficult to finely control the power due to a deviation of the active elements therein.

Further, in the reception mode of operation, since the same frequency is used, the carrier of the transmitter may be reversely supplied to the receiver, which results into a deterioration of the reception sensitivity.

The following patents each disclose features in common with the present invention but do not teach or suggest the specifically recited power control technique for controlling the transmission power of a radio transmitter/receiver using a same frequency as in the present invention: U.S. Pat. No. 5,487,179 to Larsson, entitled Arrangement For Duplex Transmission Having Transmitter Power Control, U.S. Pat. No. 5,551,057 to Mitra, entitled Cellular Mobile Radio System Power Control, U.S. Pat. No. 5,574,993 to Kobayashi et al, entitled Mobile Communication Apparatus And Method, U.S. Pat. No. 5,566,363 to Senda, entitled Transmission Power Control Circuit And Mobile Communication System Incorporating The Circuit, U.S. Pat. No. 4,590,417 to Tanaami et al., entitled Voltage Controlled Diode Attenuator, U.S. Pat. No. 4,553,105 to Sasaki, entitled Multistage Linear Amplifier For A Wide Range Of Input Signal Levels, U.S. Pat. No. 4,999,583 to Washburn et al., entitled Amplifier Drive Controller, U.S. Pat. No. 5,307,512 to Mitzlaff, entitled Power Control Circuitry For Achieving Wide Dynamic Range In A Transmitter, U.S. Pat. No. 5,241,694 to Väisänen et al., entitled Circuit For Forming Low Power Levels In A Transmitter Of A Radio Telephone, U.S. Pat. No. 5,179,353 to Miyake, entitled Power Control Circuit Used For Both Analog/Digital Dual Mode, U.S. Pat. No. 5,152,004 to Väisänen et al., entitled Procedure For Forming Low Power Levels In A Radio Telephone Transmitter, U.S. Pat. No. 5,646,578 to Loh et al., entitled Wide Dynamic Range Power Amplifier, U.S. Pat. No. 5,507,016 to Okuhara, entitled Power Control Circuit For A Digital Radio Telephone, U.S. Pat. No. 5,438,683 to Durtler et al., entitled Automatic Level Control Circuit For Dual Mode Analog/Digital Cellular Telephone, U.S. Pat. No. 5,430,411 to Boulic, entitled High-Frequency Amplifier Arrangement, Transceiver Station Comprising Such An Amplifier Arrangement And Mobile Radio System Comprising Such Stations, and U.S. Pat. No. 5,410,729 to Kumagai et al., entitled Signal Transmission Device Having An Automatic Transmission Level Control Circuit Used In A Multi-Carrier Transmission Terminal Equipment And Multi-Carrier Transmission Terminal Equipment Employing The Transmission Device.

SUMMARY OF THE INVENTION

It is therefore an object of the present invention to provide a power control circuit with a variable attenuator capable of preventing a sensitivity of a receiver from being lowered and finely controlling power, in a radio transmission/reception system using a same frequency.

According to an aspect of the present invention, a power control circuit in a radio communication system including a receiver for receiving a transmission signal and a transmitter for transmitting a signal in the air through an antenna includes first and second variable attenuators, respectively disposed at an intermediate frequency stage and a local oscillator signal stage, so as to finely control a power level of a next radio frequency stage; and a central processing unit for generating control signals fed to the first and second variable attenuators, to control the amounts of attenuation of the first and second variable attenuators.

Each of the first and second attenuators includes a first pin diode connected so as to be turned on in response to a signal level from the intermediate frequency stage and so as to generate a first current flowing toward an output of the attenuator, and a second pin diode connected so as to be turned on in response to a signal level from the central processing unit and so as to generate a second current flowing in an opposite direction of the first current.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 2 is a block diagram of a radio transmission/reception system according to an embodiment of the present invention;

DETAILED DESCRIPTION OF THE PREFERRED EMBODIMENT

Figure 1:
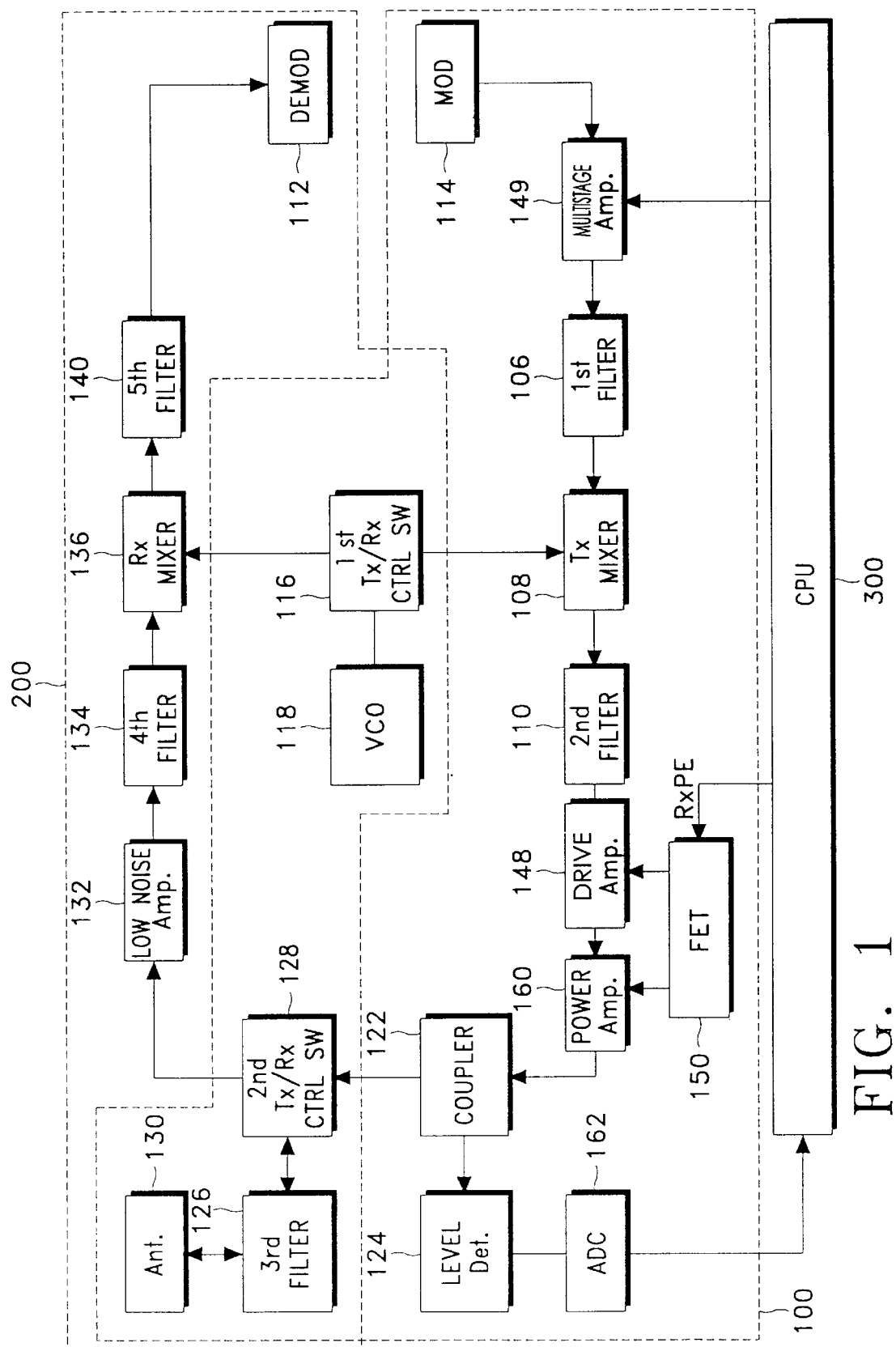
FIG. 1 is a block diagram of an earlier radio transmission/reception system.

A preferred embodiment of the present invention will be described in detail hereinbelow with reference to the attached drawings, in which like reference numerals represent like elements. Further, it should be clearly understood that many specifics such as the detailed circuit elements are shown only by way of an example to bring a better understanding of the present invention and the present invention may be embodied without those specifics. Moreover, it should be noted that detailed descriptions of the related prior art may have been intentionally omitted if it was believed to be unnecessary in describing the concepts of the present invention.

Referring to FIG. 1, an earlier power control circuit includes a transmitter 100, a receiver 200, and a central processing unit (CPU) 300. In a transmission mode by the transmitter 100, a modulation signal output from a modulator 114 is firstly amplified by a multistage amplifier 149 in an intermediate frequency (IF) stage and transferred to an input of a first mixer 108 via a first filter 106. Further, a local oscillator signal output from a voltage controlled oscillator (VCO) 118 is transferred to another input of the first mixer 108 via a first transmission/reception control switch 116. Then, the first mixer 108 mixes the modulation signal with the local oscillator signal, to generate a radio frequency signal. Thereafter, the radio frequency signal output from the first mixer 108 is filtered by a second filter 110 and supplied to a multistage amplifier in a radio frequency (RF) stage, i.e., a drive amplifier 148 and a power amplifier 160. The second filter 110 is used to remove noise components generated by the characteristics of the first mixer 108 during the mixing of the modulation signal and the local oscillator signal supplied to the first mixer 108. The gain controlled signal output from the power amplifier 160 is supplied to a coupler 122 and transmitted in the air via a second transmission/reception control switch 128, a third filter 126, and an antenna 130. Further, the coupler 122 divides a power of the power amplifier 160, so as to allow a level detector 124 to detect a power level of the gain controlled signal output from the power amplifier 160. The level detector 125 provides the central processing unit 300 with the level detection result, via an analog-to-digital converter (ADC) 162. The central processing unit 300 detects the magnitude of the signal output from the level detector 124 and generates control signals to control the outputs of the multistage amplifier 149, the drive amplifier 148, and the power amplifier 160, so as to control the transmission power. The first and second transmission/reception control switches 116 and 128 determine a transmission/reception path under the control of the central processing unit 300.

Further, in a reception mode, the receiver 200 receives reception data via the antenna 130. The reception data is supplied to a low noise amplifier 132 by way of the third filter 126 and the second transmission/reception control switch 128. A signal amplified by the low noise amplifier 132 is filtered by a fourth filter 134 and supplied to an input of a second mixer 136. The local oscillator signal output from the voltage controlled oscillator 118 is supplied to another input of the second mixer 136 via the first transmission/reception control switch 116. The second mixer 136 mixes the above mentioned signals supplied to the inputs thereof to generate a demodulation signal. The demodulation signal is supplied to a demodulator 112 via a fifth filter 140, and demodulated into an original signal by the demodulator 112.

Referring to FIG. 2, a radio transmission/reception system according to the present invention includes a transmitter 100A, a receiver 200, and a central processing unit 300 for controlling the transmitter 100A and the receiver 200. The transmitter/receiver (100A and 200) may be divided into an IF (intermediate frequency) stage, a local oscillator signal stage, an RF (radio frequency) stage, and a mixer stage (108 and 136) according to the functions.

That is, the IF stage includes a modulator 114, a second variable attenuator 144 and a first filter 164 of the transmitter 100A, and a demodulator 112 and a fifth filter 140 of the receiver 100. The local oscillator signal stage includes a voltage controlled oscillator 118 and a first transmission/reception control switch 116 shared by the transmitter 100A and the receiver 200, and a first variable attenuator 142 of the receiver 100A. Further, the RF stage includes an antenna 130, a third filter 126, a second transmission/reception control switch 128 shared by the transmitter 100A and the receiver 200, a second filter 110, a drive amplifier 148, a power amplifier 160, a FET 150, a coupler 122 and a level detector 124 of the transmitter 100A, and a low noise amplifier 132 and a fourth filter 134 of the receiver 200.

During the operation of the transmitter 100A, a modulation signal output from the modulator 114 is attenuated by the second variable attenuator 144 and supplied to the first filter 146. The amount of attenuation of the second variable attenuator 144 is determined by a control signal from the central processing unit 300. Namely, a digital control value generated by the central processing unit 300 is converted into an analog control signal by a digital-to-analog converter (DAC) 147 and supplied to the second variable attenuator 144. An intermediate frequency signal output from the second variable attenuator 144 is filtered by the first filter 164 and supplied to an input of the first mixer 108. A local oscillator signal output from the voltage controlled oscillator 118 is supplied to the first variable attenuator 142 via the first transmission/reception control switch 116. Here, being controlled in the same manner as the second variable attenuator 144, the first variable attenuator 142 attenuates the local oscillator signal input and transfers an output thereof to another input of the first mixer 108. The first mixer 108 mixes the input signals supplied to the inputs thereof. A mixed signal output from the first mixer 108 is filtered by the second filter 110 to remove noise components therefrom and transferred to a multistage amplifier composed of the drive amplifier 148 and the power amplifier 160. Here, the multistage amplifier amplifies a power level of the input signal supplied thereto, to provide a next stage with a radio frequency with a desired power according to a control signal generated by the central processing unit 300. Thus, when operation in the reception mode, the central processing unit 300 generates a transmission power enable signal RxPE to the FET 150, thereby cutting off power being supplied to the multistage amplifier. A power amplified signal output from the multistage amplifier is transmitted in the air by way of the coupler 122, the second transmission/reception control switch 128 and the antenna 130. Here, the coupler 122 provides the level detector 124 with a part of the power amplified signal from the multistage amplifier, in order to detect an amplitude of the power amplified signal output. The level detector 124 measures the level of the power amplified signal. A level detection signal output from the level detector 124 is converted into a digital signal by an analog-to-digital converter (ADC) 162 and transferred to the central processing unit 300. Then, the central processing unit 300 controls outputs of the first and second variable attenuators 142 and 144, and the multistage amplifier, based on the digital signal from the analog-to-digital converter 162.

Figure 3A:
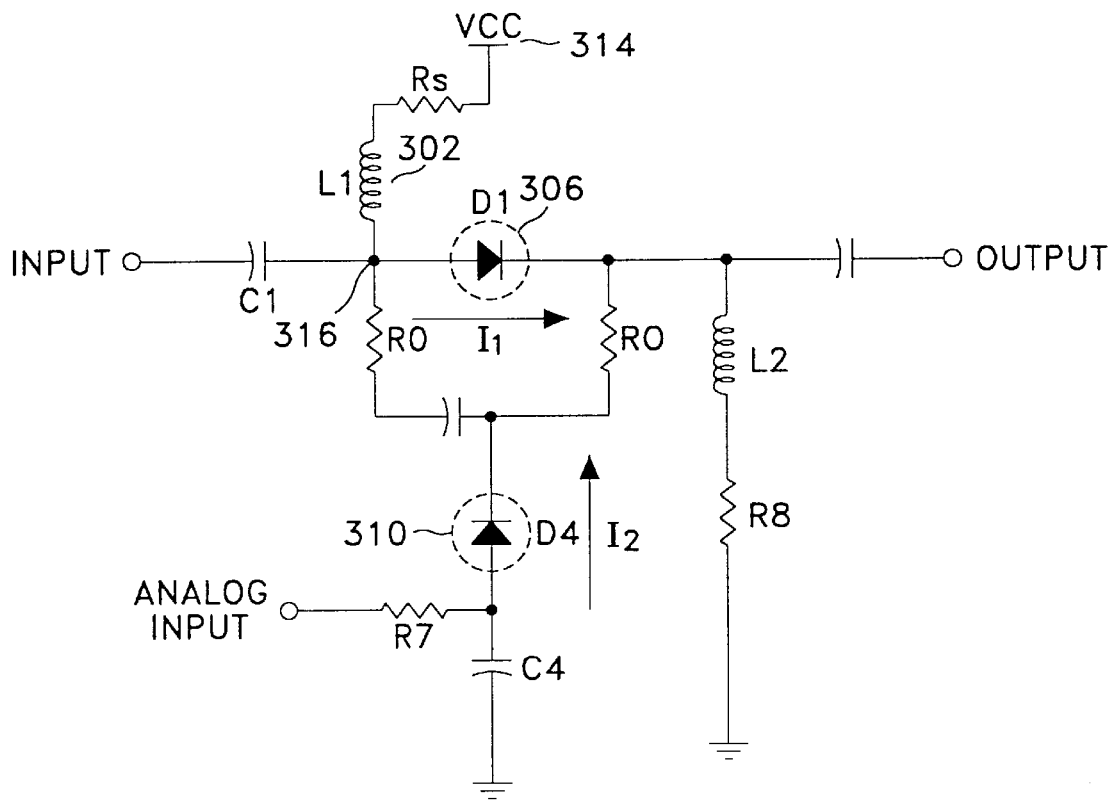
FIGS. 3A and 3B are detailed circuit diagrams of a variable attenuator according to a preferred embodiment of the present invention.
Figure 3B:
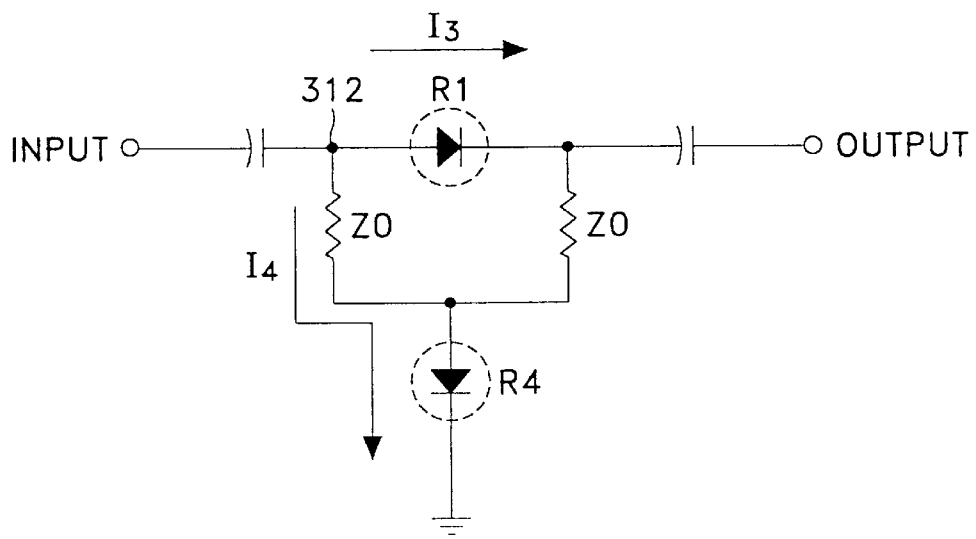

Referring to FIGS. 3A and 3B, there is illustrated a detailed circuit diagram of the first and second variable attenuators 142 and 144 according to a preferred embodiment of the present invention, in which FIG. 3A illustrates a detailed circuit diagram and FIG. 3B illustrates an equivalent diagram thereof. As illustrated, the variable attenuator includes first and second pin diodes 306 and 310. The first pin diode 306 is biased by the supply voltage VCC supplied to an anode thereof via a bias resistor Rs and a first inductor L1. The first pin diode 306 is turned on in response to an input signal supplied to an input terminal INPUT thereof. The second pin diode 310 is turned on in response to an analog control signal generated by the central processing unit 300. As a result, a current $I_1$ flowing via the first pin diode 306 may be offset by a current $I_2$ flowing via the second pin diode 310, thereby resulting in an attenuation. At the moment, the central processing unit 300 controls the analog control signal supplied to the second pin diode 310, to determine the amount of attenuation of the attenuator. Referring to FIG. 3B, when representing the first and second pin diodes 306 and 310 by first and second resistors R1 and R4, the amount of attenuation may be determined by:

$$R1 = Zo(10^{\frac{L}{20}} - 1), R4 = \frac{Zo}{(10^{\frac{L}{20}} - 1)}$$

where Zo represents a characteristic impedance and L represents the amount of attenuation (dB).

Figure 4:
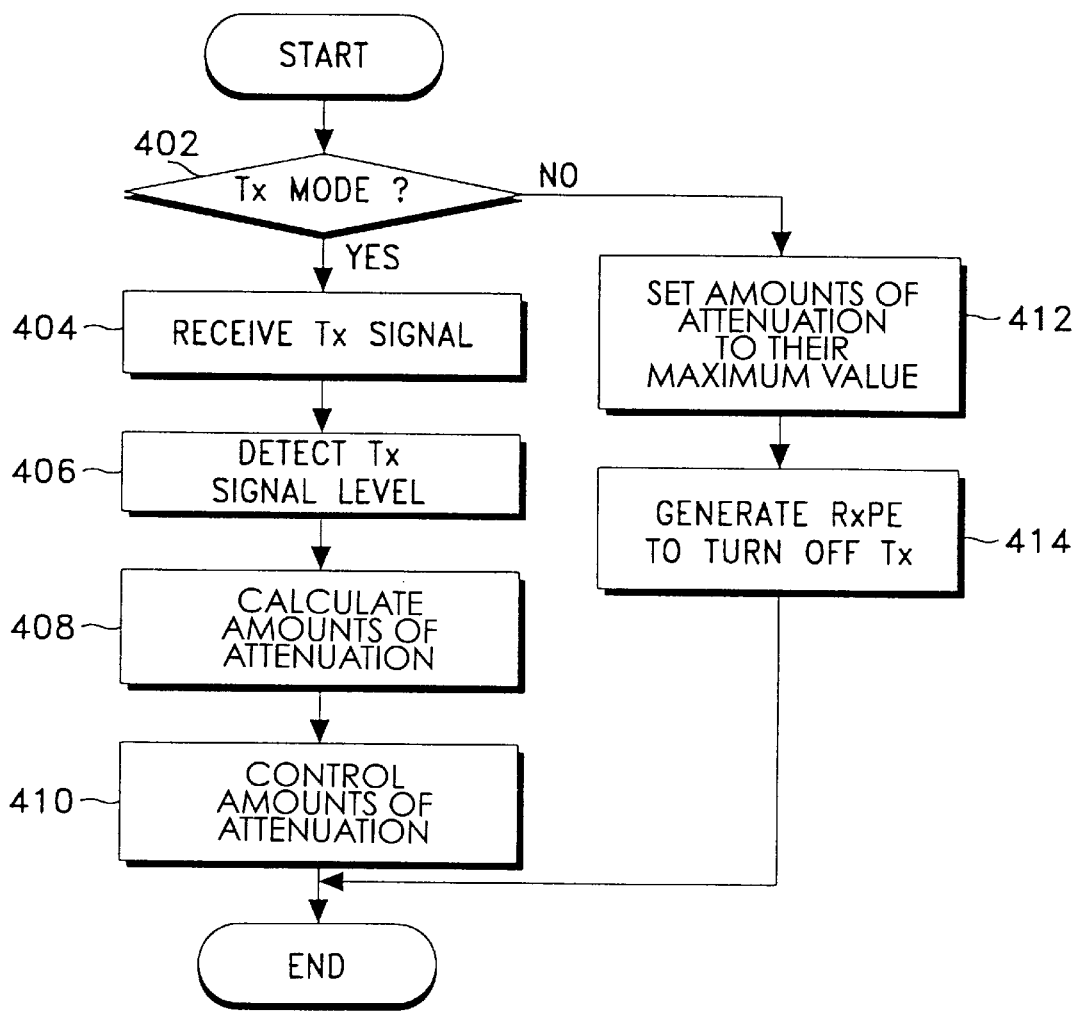
FIG. 4 is a flowchart illustrating the controlling of power of a radio transmission/reception system according to an embodiment of the present invention.

Now, referring to FIGS. 2 through 4, descriptions follow on a process for controlling a power of the radio transmission/reception system according to an embodiment of the present invention. First, at a step 402, the central processing unit 300 checks whether or not the current operation mode is a transmission mode. If it is the transmission mode, the receiver 200 will receive a transmission signal from the transmitter 100A under the control of the central processing unit 300, through steps 404 and 406. Namely, the receiver 200 receives the transmission signal from the transmitter 100A and provides it to the central processing unit 300 at the step 404. Then, the central processing unit 300 detects a power level of the transmission signal at the step 406. As the result of the detection, the central processing unit 300 calculates a level of the control signal for controlling attenuation amounts of the first and second variable attenuators 142 and 144, at a step 408. The central processing unit 300 provides the first and second variable attenuators 142 and 144 with the control signals of the calculated level, at a step 410. Here, the first variable attenuator 142 roughly controls the power of the system, and the level of the local oscillator signal controlled by this attenuator controls the gain of the first mixer 108. Further, the second variable attenuator 144 finely controls the power of the system.

However, if the current operation mode is a receiving mode at the step 402, the central processing unit 300 will generate the control signal level for controlling the first and second variable attenuators 142 and 144, so as to set the attenuation amounts to their maximum value, at a step 412. Then, at a step 414, the central processing unit 300 will generate the transmission power enable signal RxPE to the FET 150 to cut off the power being supplied to the drive amplifier 148 and the power amplifier 160 so as to completely turn off the transmitter 100A.

As described in the foregoing, the radio transmission/reception system using the same frequency according to the present invention includes the power control circuit which can prevent the sensitivity of the receiver from being lowered due to the carrier radiated from the transmitter, and finely control the power. Accordingly, the stability of the system may be improved and the power consumption of the system may be reduced.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A power control method in a radio communication system including a receiver for receiving a transmission signal and a transmitter with a variable attenuator for transmitting a signal in the air through an antenna, comprising the steps of:

detecting whether the system is in a transmission mode or a receiving mode;

if the system is in the transmission mode, receiving a transmission signal received from the antenna of said transmitter, detecting a power level of the transmission signal and controlling an amount of attenuation of said variable attenuator in the transmitter in response thereto; and if the system is in the reception mode, controlling an amount of attenuation of said variable attenuator so as to become a maximum value and generating a transmission power enable signal to cut off power being supplied to a multistage radio frequency stage in said transmitter, so as to turn off said transmitter.

2. A radio communication system including a receiver for receiving a transmission signal and a transmitter for transmitting a signal in the air through an antenna, comprising:

the transmitter comprising:
a modulator for providing a modulated output signal;
a first variable attenuator for receiving the output of the modulator and for providing a variably attenuated output in response to a control signal input thereto;
a first filter connected to an output of said first attenuator;
a first mixer connected to an output of said first filter;
a second variable attenuator providing a variably attenuated output to another input of said first mixer in response to a control signal input thereto;
a second filter for receiving an output of said first mixer;
a multistage amplifier connected to an output of said second filter for providing power amplification;
a coupler connected to an output of said multistage amplifier for providing a first output and a second output;
a voltage controlled oscillator having an output;
a first transmission/reception control switch for receiving said output of said voltage controlled oscillator and for providing an input to said second attenuator;
a second transmission/reception control switch for receiving a signal from said first output of said coupler and for providing selectively controlled first and second outputs;
a third filter for receiving and filtering said first output of said second transmission/reception control switch;
an antenna for connection to said third filter;
a level detector for receiving said second output of said coupler; and
an analog-digital converter for receiving an output of said level detector; said receiver comprising:
a low noise amplifier connected to said second output of said second transmission/reception control switch;
a fourth filter for receiving and filtering an output of said low noise amplifier;
a second mixer for receiving an output of said fourth filter and a second output of said first transmission/reception control switch;

a fifth filter for receiving an output of said second mixer;
a demodulator for receiving an output of said fifth filter;
a central processing unit for receiving an output of said analog-to-digital converter and for generating first and second control signals respectively fed to first and second digital-to-analog converters having outputs which are respectively fed to control inputs of said second and first variable attenuators and further comprising a third control output for providing a signal to a control circuit for controlling turn on and turn off of said multistage amplifier; and
said central processing unit controlling said first and second variable attenuators and turning said multistage amplifier on and off in response to an output of said level detector and the transmission/reception mode of said system.

3. A radio communication system according to claim 2, each of said first and second variable attenuators comprising:
a first pin diode connected so as to be turned on in response to a signal input thereto and so as to generate a first current flowing toward an output of said attenuator; and
a second pin diode connected so as to be turned on in response to a signal level from said central processing unit via said digital-to-analog converter and so as to generate a second current flowing in an opposite direction of said first current.

4. A radio communication system comprising:
a receiver for receiving a transmission signal and a transmitter for transmitting a signal in the air through an antenna, said transmitter having a variable attenuator;
a mode detector for detecting whether the system is in a transmission mode or a receiving mode;
a power level detector for detecting a power level of the transmission signal and for controlling an amount of attenuation of said variable attenuator in the transmitter in response thereto, upon said mode detector detecting that the system is in a transmission mode; and
a controller for controlling an amount of attenuation of said variable attenuator so as to become a maximum value and for generating a transmission power enable signal to cut off power being supplied to a multistage radio frequency stage in said transmitter so as to turn off said transmitter, upon said mode detector determining that the system is in the reception mode.

5. The system according to claim 4, said variable attenuator comprising two PIN diodes.

* * * * *